(12) United States Patent
Kelkar et al.

(10) Patent No.: US 6,462,426 B1
(45) Date of Patent: Oct. 8, 2002

(54) BARRIER PAD FOR WAFER LEVEL CHIP SCALE PACKAGES

(75) Inventors: Nikhil Vishwanath Kelkar, San Jose, CA (US); Stephen A. Gee, Danville, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/738,122

(22) Filed: Dec. 14, 2000

(51) Int. Cl.$^7$ .......................... H01L 23/48; H01L 23/52
(52) U.S. Cl. ................... 257/781; 257/781; 257/761; 257/737; 257/762
(58) Field of Search ................. 257/761, 781, 257/737, 762

(56) References Cited

U.S. PATENT DOCUMENTS

| | | | |
|---|---|---|---|
| 5,629,564 A | * | 5/1997 | Nye, III et al. ............. 257/762 |
| 5,656,858 A | * | 8/1997 | Kondo et al. ............... 257/737 |
| 6,020,640 A | * | 2/2000 | Efland et al. .............. 257/751 |
| 6,049,130 A | * | 4/2000 | Hosomi et al. ............. 257/750 |
| 6,249,044 B1 | * | 6/2001 | Kao et al. .................. 257/678 |

FOREIGN PATENT DOCUMENTS

JP  406177136 A  * 6/1994

* cited by examiner

*Primary Examiner*—Eddie Lee
*Assistant Examiner*—Joseph Nguyen
(74) *Attorney, Agent, or Firm*—Beyer Weaver & Thomas LLP

(57) ABSTRACT

An integrated circuit device comprising a semiconductor die having a plurality of conductive pads. Over the conductive pads is formed a passivation layer that has a plurality of passivation layer openings. The passivation layer openings are positioned over an associated one of the conductive pads. Barrier base pads are placed in electrical contact with the conductive pads such that a portion of each of barrier base pads cover at least the perimeter of each passivation layer opening. Each of the barrier base pads prevents cracks from propagating through the integrated circuit device. In another aspect of the invention, the integrated circuit device is attached to an external substrate by connecting the contact bumps to the bond pads on an electronic substrate. In yet another aspect of the invention, a method for manufacturing the integrated circuit device is described.

21 Claims, 4 Drawing Sheets

BARRIER PAD FOR WAFER LEVEL CHIP SCALE PACKAGES

FIELD OF THE INVENTION

The present invention relates generally to integrated circuit packages with bump type contacts. More particularly, the invention relates to package interconnect structures for absorbing stresses introduced to such bumps after these packages are attached to an external substrate, for example.

BACKGROUND

There are a number of conventional processes for packaging integrated circuits. One approach, which is commonly referred to as "flip chip" packaging, generally contemplates forming solder contact bumps (or other suitable contacts) directly on I/O pads formed on an integrated circuit die. The die is then typically attached to an electronic substrate such as a printed circuit board such that the die contacts directly connect to corresponding contacts on the substrate. The solder contact bumps are then reflowed to electrically connect the die to the substrate. A common problem occurs when flip chips are attached to a substrate. The problem is that, the heat generated by the flip chip during operation causes the die and the substrate to expand and/or contract at different rates due to their different coefficients of thermal expansion (CTE). This thermal cycling fatigue subjects the flip chip and its connection to the substrate to fatigue damage that ultimately shortens the useful life of the electronic device.

FIG. 1 is provided to give a better understanding of the damage suffered by flip chips during thermal cycling. Specifically, FIG. 1 illustrates a side plan, cross-sectional view of a single solder bump contact 100 of a flip chip 102 that is attached to a printed circuit board (PCB) 104. For purposes of simplicity, only one of the plurality of solder bump contacts 100 of the flip chip 102 is shown. Typically, flip chips contain conductive pads 106 formed on the top surface of the semiconductor die 108. The conductive pad 106 leads to the electronic circuitry (not shown) integrated within the die 108. A layer of passivation material 110 is applied such that the top surface of the die 108 is covered and an opening in the passivation material 110 provides exposes an inner portion of the conductive pad 106. A resilient material layer 112 is then formed over the passivation layer 110 such that an opening in the resilient layer 112 coincides with the opening in the passivation layer 110, thereby providing access to the conductive pad 106. A layer of under bump metal (UBM) 114 is then formed within the resilient and passivation layer openings. The solder bump contact 100 is then formed on top of the UBM 114. The solder bump contact 100 is reflowed in order to be connected to the PCB bond pad 116. The form of the solder bump contact 100 is dependent upon the size of the UBM 114 and the PCB bond pad 116 since the solder material collects and solidifies on these surfaces. Typically, the PCB bond pad 116 has a diameter of 300 um and the UBM has a diameter of 150 um. As a result, the contact bump 100 is asymmetrically shaped, as it increases in diameter from the UBM 114 towards the PCB bond pad 116.

Also shown in FIG. 1 are cracks 118 and 120, which formed as a result of temperature cycling fatigue. Cracks 118 are shown as initiating near the outer edge of the UBM 114 and propagating through the solder bump contact 100. Cracks 120 are shown to have initiated near the outer edge of the UBM and propagated inwardly to the surface of the conductive pad 106, such that the cracks 120 have completely propagated through the resilient material layer 112 and the passivation layer 110. Generally, cracks propagate through the resilient material layer 112 and the passivation layer 110 faster than through the solder bump 100 since the solder bump material is a more ductile material. The cracks 120 become arrested at the surface of the conductive pad 106 due to the highly ductile properties of the conductive pad 106. For instance, the conductive pads 106 are often formed of Aluminum. The diameter of the conductive pad 106 is generally formed to be larger than the diameter of the UBM 114 so that the conductive pad 106 can be used to arrest the cracks propagating through the resilient and passivation material layers. A smaller conductive pad 106 would allow the cracks 120 to propagate around and underneath the edges of conductive pad 106 and through the semiconductor die 108 until the entire solder bump contact 100, together with fragments of the semiconductor die 108 break away from the die 108. As may be appreciated, the damage illustrated in FIG. I may be caused by factors other than temperature cycling. For instance, vibrations due to external operational conditions may also cause structural damage to the electrical system.

One possible configuration allowing for a more structurally robust flip chip package involves forming a UBM 114 having a larger diameter such that its diameter is approximately equal to the diameter of the PCB bond pad 116. This may be done, for example, by extending the portion of the UBM 114 covering the resilient material, referred to as the lip 114a. This configuration results in a solder bump contact that solidifies, after being reflowed, into a more symmetrical shape. The resulting symmetrical shape of the solder bump contact has respective diameters near the UBM 114 and near the PCB bond pad 116 that are more closely equal to each other, unlike, and in contrast to the asymmetrical shape of the solder bump contact 100 in FIG. 1. Symmetrically shaped solder contact bumps are more flexible, and therefore absorb and distribute stresses in a manner that more effectively preserves the structural integrity of the flip chip package and PCB. In order to fabricate semiconductor devices having larger UBMs, the underlying and supporting conductive pads 106 must also be enlarged so that the crack arresting ability of the conductive pads is utilized. Unfortunately, however, increasing the diameter of the conductive pads 106 reduces the number of integrated circuits that may be fabricated within the semiconductor die since the larger conductive pads 106 must occupy more of the limited semiconductor surface area. Ultimately, this flip chip configuration is able to increase its structural integrity only at the expense of reduced functionality.

In view of the foregoing, an improved flip chip design would be desirable such that upon connection to an electronic substrate, the flip chip exhibits structurally robust properties without sacrificing the flip chip's degree of functionality.

SUMMARY

The present invention pertains to bumped-type semiconductor devices designed to have structurally robust characteristics without sacrificing the device's degree of functionality. The integrated circuit device of the present invention includes a semiconductor die having a plurality of conductive pads. Over the conductive pads is formed a passivation layer that has a plurality of passivation layer openings. At least one of the passivation layer openings are each positioned over an associated one of the conductive pads. Barrier base pads are placed in electrical contact with the conductive pads such that a portion of each of barrier base pads cover at least the perimeter of each passivation layer opening thereby preventing cracks from propagating through the integrated circuit device.

In another aspect of the invention, the integrated circuit device is attached to an external substrate by connecting the contact bumps to the bond pads on an electronic substrate.

In yet another aspect of the invention, a method for manufacturing the integrated circuit device using the inventive barrier base pad is described.

These and other features and advantages of the present invention will be presented in more detail in the following specification of the invention and the accompanying figures which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

Figure 1:
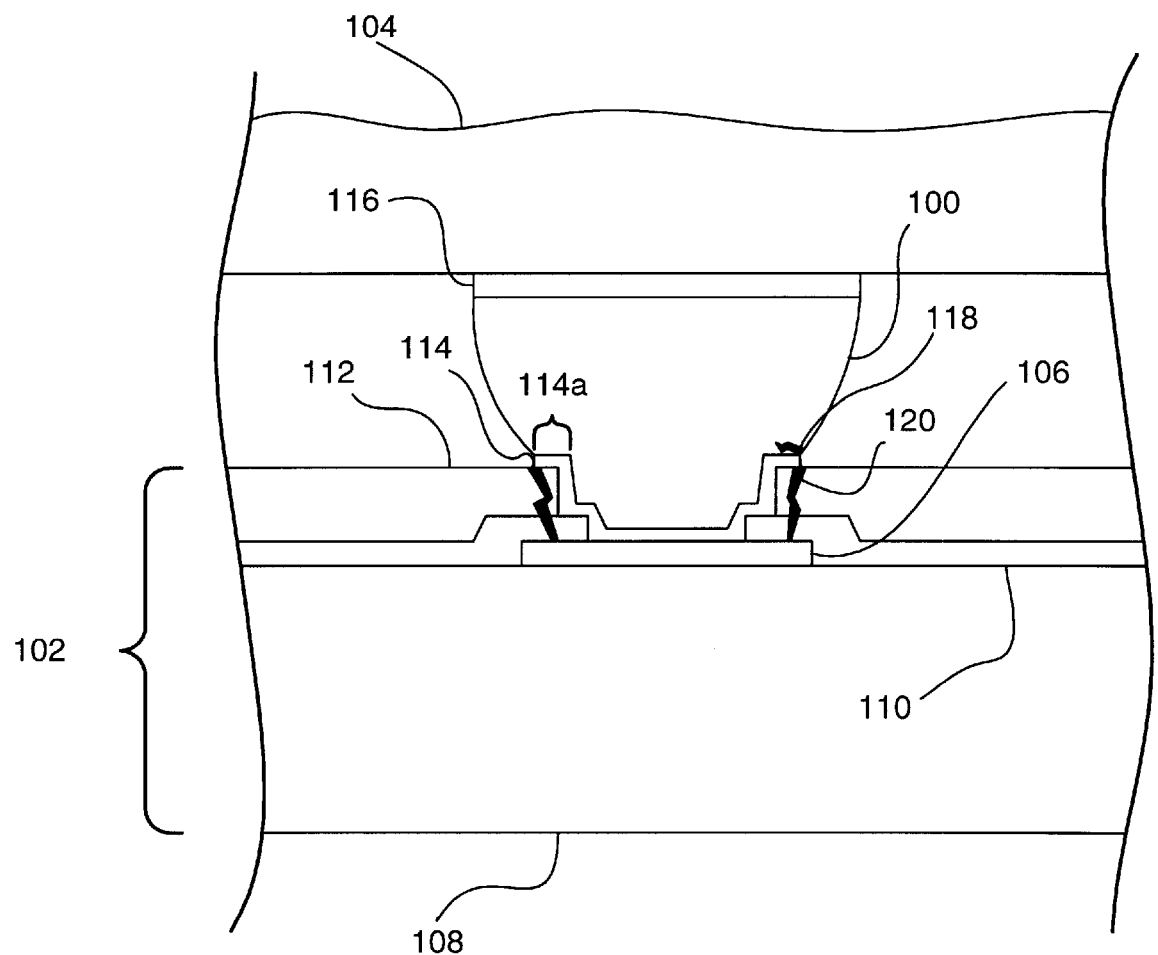
FIG. 1 illustrates a side plan, cross-sectional view of a single solder bump contact of a semiconductor device that is attached to an electronic substrate, as is conventionally known in the art.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Generally, the present invention pertains to bumped-type semiconductor devices designed to have structurally robust characteristics. As with typical bumped-type devices, the devices of the present invention include a semiconductor die having conductive pads formed on the surface of the die. On the top surface of the die is generally formed a passivation layer. Within the passivation layer are formed openings that expose selected conductive pads. An inventive barrier base pad is then formed in electrical contact with each of the exposed conductive pads such that the barrier base pad covers the exposed portions of the conductive pads and at least the portion of the passivation layer forming the openings. A layer of resilient material is then formed at least over the barrier base pad such that an opening in the resilient material exposes a portion of the barrier base pad. An under bump metalization is formed electrically connected to the barrier base pad such that the previously exposed portion of the barrier base pad and at least the portion of the resilient material forming the opening is covered by the under bump metalization. Finally, on top of the under bump metalization is formed the contact bumps, typically in the form of balls of solder paste material.

The barrier base pads act to arrest the propagation of cracks that tend to initiate near the outer edges of the under bump metalization. As the size of the under bump metalization is increased to obtain a more symmetrical, and therefore more flexible, contact bump, the size of the base pad is correspondingly increased for crack arresting purposes. Since the base pads take on the conductive pad's role in arresting crack propagation, the size of the conductive pads do not need to be increased proportionally to the size of the under bump metalization. Maintaining the size of the conductive pads advantageously preserves space within the semiconductor device that can be used to embed integrated circuits. Furthermore, the size of the conductive pad may actually be decreased to provide more space within the semiconductor die for integrated circuits.

The present invention will now be described with respect to a contact bump formed on the top surface of a semiconductor die. For the purposes of simplifying the description of the present invention, only one contact bump is illustrated. However, it should be appreciated that typical semiconductor die include a plurality of contact bumps. It should also be appreciated that the present invention may be implemented on semiconductor wafers that have contact bumps.

Figure 2:
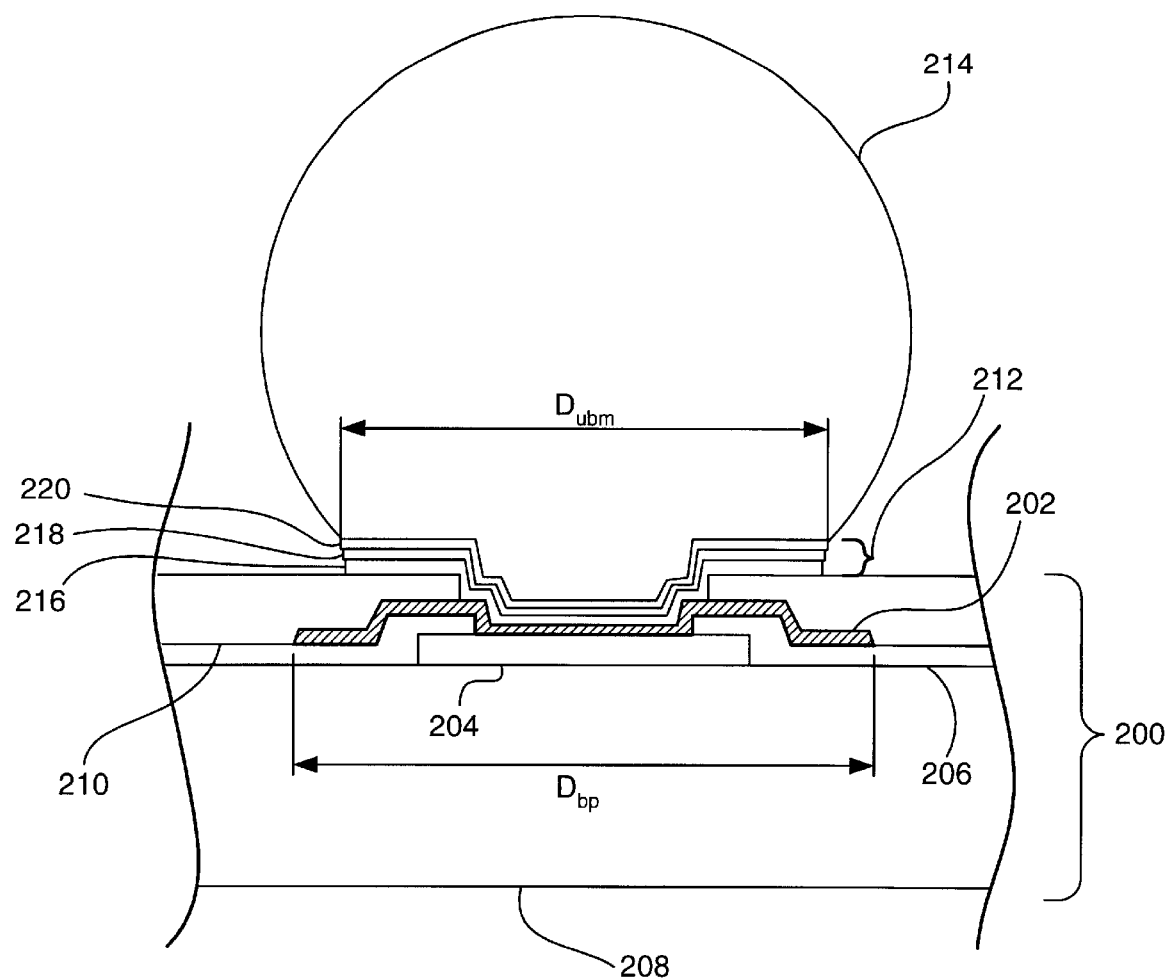
FIG. 2 illustrates a side plan, cross-sectional view of a barrier base pad formed within a semiconductor device, according to one embodiment of the present invention.

Now turning to FIG. 2, a side plan, cross-sectional view of a portion of a semiconductor die 200 having a barrier base pad 202, which is formed over a conductive pad 204 and portions of a passivation layer 206, is shown. The barrier base pad 202, which is a pad of metal, covers a portion of the conductive pad 204 that is not covered by the passivation layer 206 and a portion of the passivation layer 206 that surrounds the conductive pad 204. The base pad 202 serves to prevent cracks from propagating through the semiconductor package and thereby improves the structural integrity of the package. The passivation material layer 206, which covers the outer edges of the conductive pad 204 and the top surface of the semiconductor substrate 208, serves to protect the semiconductor material. The conductive pad 204 is formed on the top surface of the semiconductor substrate 208 and is generally coupled to integrated circuit structures (not shown) within the semiconductor substrate 208.

A layer of resilient protective material 210 is formed over portions of the base pad 202 and the passivation layer 206 such that an opening within the resilient layer 210 exposes a portion of the base pad 202. As is known in the art, the resilient material layer 210 acts to absorb stresses imposed upon the semiconductor device package. The UBM 212 is formed within the opening in the resilient material layer 210. The UBM 212 covers the surface of the base pad 202 that is exposed through the resilient material 210 and extends upward and outwardly such that the UBM 212 also covers the portion of the resilient material layer 210 that forms the opening in the resilient material layer 210. Finally, the contact bump 214 is formed over the UBM 212, thereby being coupled to the conductive pad 204 through the UBM 212 and the base pad 202.

The base pad 202 generally has a circular transverse cross-sectional area and a diameter, $D_{bp}$. It should be noted that the transverse, cross-sectional area may have shapes other than circular, for example, square, oval or polygon. The base pad 202 may be formed of materials such as aluminum, copper, nickel vanadium, titanium, tungsten or other conductive material with crack inhibiting properties. The UBM 212 also has a circular transverse cross-sectional area and a diameter, $D_{ubm}$. It should be noted that the transverse, cross-sectional area of the UBM 212 may also have shapes other than circular, for example, square or oval.

The present invention requires a size relationship between the barrier base pad 202, $D_{bp}$, and the UBM such that the diameter of the base pad 202 is approximately the same size or larger than the diameter, $D_{ubm}$, of the UBM 212. In this manner, the base pad 202 extends outwardly a sufficient distance so to block the propagation of any cracks through the resilient layer 210 that originate near the outer edges of the UBM 212. The ability to extend the diameter of the base pad 202 to at least the same size as the UBM 212 provides more freedom to size the UBM 212 with respect to the contact pads on the PCB. At the same time, the UBM 212 may be enlarged without having to enlarge the size of the conductive pad 204. Advantageously, this avoids sacrificing valuable space on the semiconductor die that can be embedded with integrated circuits. Furthermore, the base pad 202 provides the design capability of forming smaller conductive pads since it no longer serves as a crack arresting barrier. Smaller sized conductive pads 204 allow an increased amount of integrated circuits to be embedded within the semiconductor substrate 208. It should be noted that the minimum size to which conductive pads 204 may currently be formed is in the range of approximately 110–120 um. Further reduced sizes may cause an overload of voltage within the conductive pad 204 and cause failure. However, smaller conductive pads 204 may be formed depending upon future advances in the semiconductor fabrication industry.

For comparison purposes, consider a scenario not in accord with the required size relationship between the base pad 202 and the UBM 212. In such a scenario, the UBM 212 may be sized larger than both the base pad 202 and the conductive pad 204. As a result, cracks initiating near the outer edge of the UBM 212 would propagate through the resilient layer 210, around both the base pad 202 and the conductive pad 204, and through the semiconductor substrate 208. Such crack would cause damage to the circuitry fabricated on the silicon substrate.

The particular embodiment of the UBM 212 shown in FIG. 2 is formed of three layers of material. The bottom layer 216 is formed of Aluminum, the middle layer 218 is formed of Nickel-Vanadium, and the top layer 220 is formed of Copper. This combination of materials facilitates bonds between the bottom layer 216 and the resilient material 210 and the base pad 202, and between the top layer 220 and the contact bump 214. Of course, different numbers of layers, types and combinations of materials may be used to form the UBM 212 subject to specific design constraints of various device embodiments.

The resilient protective layer 210 may be formed of any material suitable for absorbing the stresses imposed upon the semiconductor device. Preferably, the resilient protective material has a modulus of elasticity that is less than about 3.0 GPa. Also, preferably, the resilient protective material can withstand high temperatures so that high temperature solder material may be used for attaching the package to an external substrate. For example, a polyimide or benzocyclobutene (BCB) material meets the above requirements, and, thus, works well as a resilient protective layer.

In the illustrated embodiment, the layer of resilient protective material 210 extends beyond the edges of the base pad 202, thereby covering portions of the passivation layer 206. In alternative embodiments, the layer of resilient material 210 may extend only as far as the outer edges of the base pad 202, thereby only covering portions of the base pad 202.

The contact bump 214 is formed using conventional solder bumping or balling techniques. The pitch of the contact bumps varies with each application of the package. However, the pitch of the contact bumps has a significant impact on ease of application of this package and associated costs, such as assembly costs. Preferably, a pitch is chosen such that existing surface mount assembly techniques and equipment may be utilized in a cost-effective manner. For example, a contact bump pitch of about 500 μm works well with existing surface mount techniques and equipment.

The conductive pad 204 may be formed from any suitably conductive material, such as metal. For example, aluminum, copper, or various alloys may be selected. The passivation layer 206 may be formed from any suitable insulation type material, such as silicon dioxide ($SiO_2$).

Ultimately, the semiconductor package will be inverted and placed onto an external substrate. The solder in the contact bump 214 will then be reflowed so that the contact bump 214 couples to an associated contact on the board. Of course, the other contact bumps (not shown) on the package will be coupled to the board in a similar manner. The external substrate may have a variety of forms that are suitable for electrically coupling the semiconductor package to one or more electrical components (not shown). For example, the external substrate may be in the form of a multi-layered printed circuit board (PCB). The PCB may include a plurality of other electrical components (including other semiconductor packages) that perform a set of functions for a particular application, for example.

Although, the present invention is described as being implemented in flip chip packages, it should be understood that the present invention may be implemented on any IC package that has contact bumps in which stresses are introduced, such as surface mount type wafer level CSPs or other surface mount packages. It should also be appreciated that the base pad of the present invention can also be utilized in a semiconductor device that does not have a layer of resilient protective material.

Figure 3:
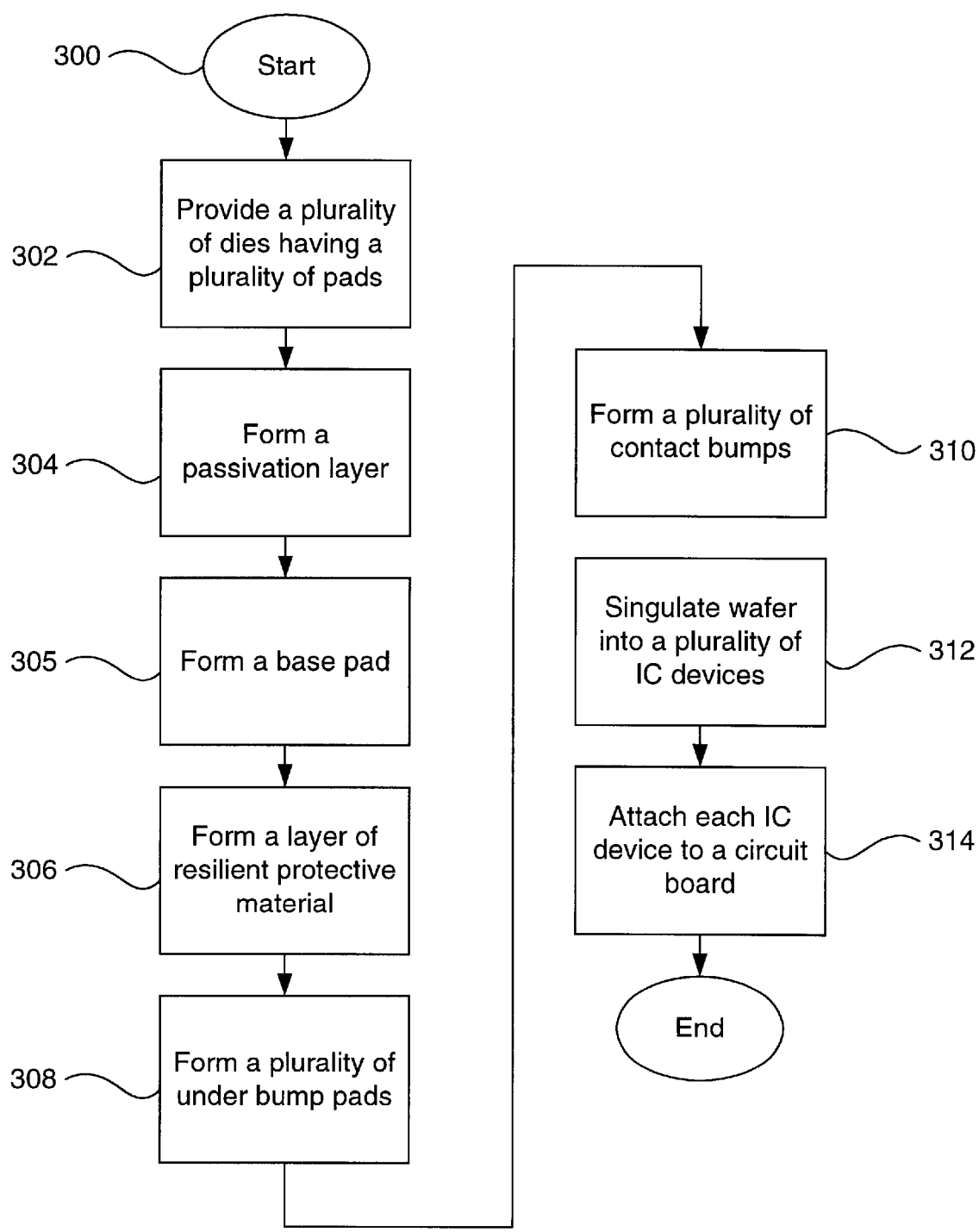
FIG. 3 is a flow diagram describing one implementation of a process for fabricating a semiconductor package incorporating the barrier base pad of the present invention.

The process of fabricating a semiconductor package incorporating the base pad of the present invention will now be described with respect to FIG. 3. Generally, the process 300 describes the fabrication of a semiconductor wafer that includes a plurality of semiconductor dies having a plurality of under bump pads formed over base pads in accordance with one embodiment of the present invention. Initially, a plurality of dies are provided in operation 302. As previously described, each die may include a plurality of integrated circuit structures, such as MOS transistors. Each die also includes a plurality of conductive pads on the top surface of the die. The integrated circuit structures, including the conductive pads, are formed using conventional fabrication techniques.

After the integrated circuit fabrication is completed, in operation 304 a passivation layer is formed over a surface of the semiconductor dies and over portions of the plurality of conductive pads. Conventional photolithography techniques are then used to pattern a plurality of opening into the insulative $SiO_2$ or SiN layers. Each passivation layer opening is positioned over an associated conductive pad.

In operation 305, a base pad is formed to cover the portion of each conductive pad that is exposed through the passivation layer and the regions of the passivation layer that surround the conductive pads. The base pad is generally formed of a metal material.

In operation 306, a resilient protective layer is formed over a region of the base pad and the passivation layer.

Openings in the resilient layer are formed and positioned over each of the base pads. In some implementations of the method, the resilient layer completely covers the surface of the passivation layer. In alternative implementations, the resilient material covers the outer regions of the base pad but does not cover any of the passivation layer. The resilient material layer may be formed by applying multiple coatings so as to build "thick" resilient material layers. For example, four to six layers works well. Preferably, the resilient material layer and the passivation layer are removed from the scribe lines of the wafer before singulation is performed.

In operation 308, a plurality of under bump pads are then formed over portions of the base pads and the resilient layer. Each under bump pad is positioned over an associated opening in the resilient material layer. The under bump pads are formed to have diameters that are approximately the same size or smaller than the diameter of the base pads. This size relationship allows the base pad to act as a barrier to arrests cracks that initiate near the edge of the under bump pads and propagating through the resilient material.

The under bump pads are formed using conventional fabrication techniques. For example, the under bump pads may be formed by a conventional sputtering technique, which technique typically results in a relatively "thin" layer of under bump pads. In specific implementations of the method, the under bump pads may be formed of multiple layers, each layer being a different material. By way of example, the under bump pads typically have a thickness of about a few thousand angstroms.

After the under bump pads are formed, a plurality of contact bumps are formed over the under bump pads in operation 310. Each contact bump is formed over an associated under bump pad. The contact bumps are formed using conventional solder attach techniques. If desired, a backside coating may be applied to the bottom surface of the wafer after operation 310. When a protective coating is used on the bottom surface of each wafer level CSP, the package requires no encapsulation, as compared with many conventional surface mount packages resulting in significant assembly cost reduction.

After the wafer level fabrication processes are completed, in operation 312 the wafer is singulated into a plurality of individual semiconductor dies. In operation 314, each individual die may then be attached to an external substrate, such as a PCB. The semiconductor dice may be attached using any technique that is suitable for the particular dice. For example, for a surface mount package, each contact bump of the package is placed over a respective board contact of the PCB. The solder of the contact bumps are then reflowed so that the contact bumps are electrically coupled with the board contacts of the PCB.

The aforementioned layers are formed using conventional fabrication techniques. For example, The patterned layers are formed using well-known photolithography techniques. Patterning is typically accomplished by depositing a photoresist layer over the layer to be patterned, and then selectively exposing the photoresist to light through a patterned reticle. Once exposed, the photoresist is developed to form a photoresist mask that is used in etching layers that are exposed and not covered by the photoresist material.

Figure 4:
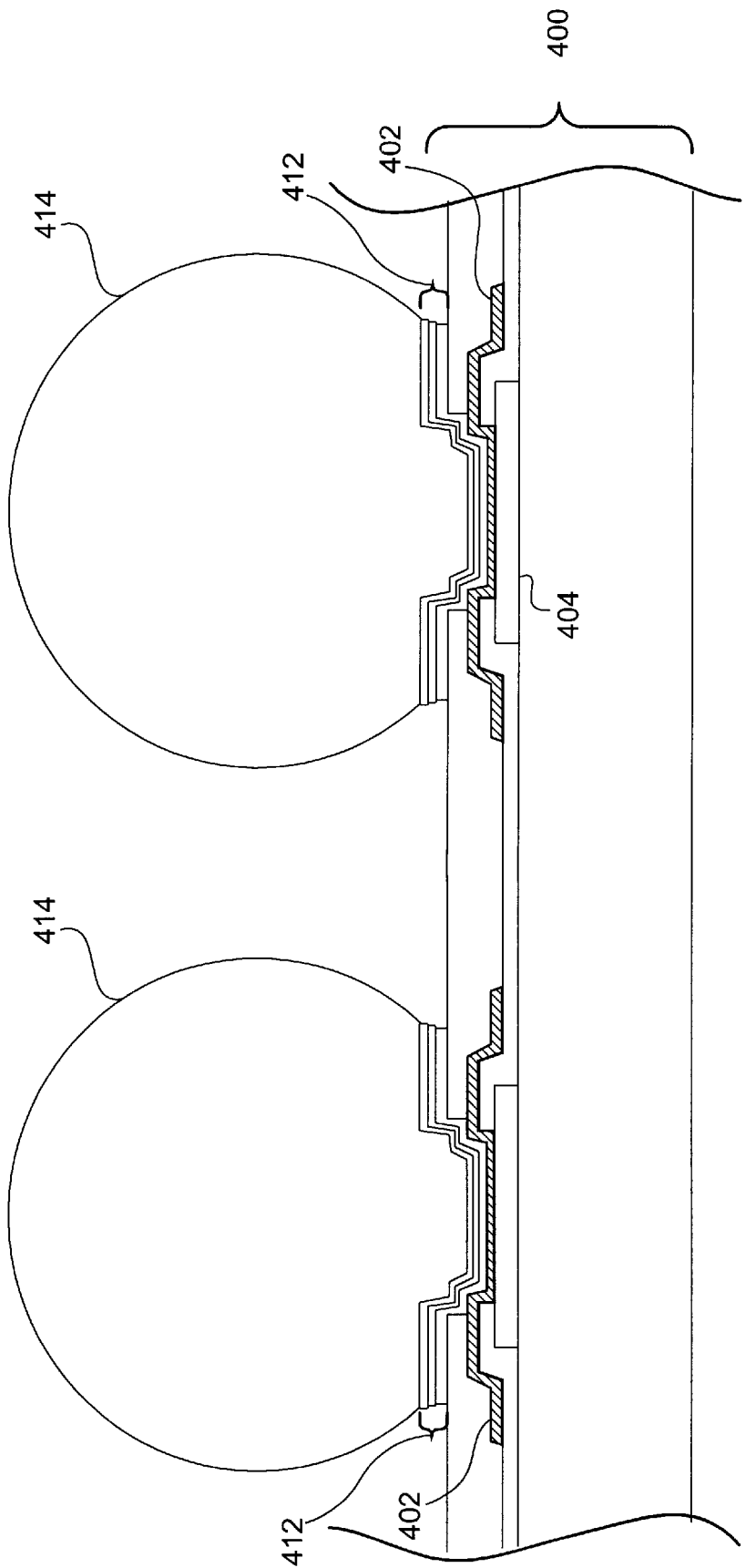
FIG. 4 illustrates a side plan cross-sectional view of a semiconductor device having two conductive bumps according to one embodiment of the present invention.

FIG. 4 illustrates a side plan cross-sectional view of a semiconductor device 400 having two conductive bumps 414 according to one embodiment of the present invention. The two contact bumps 414 are formed over UBM's 412, barrier pads 402, and conducive pads 404. Many embodiments of the present invention will have many more than two conductive bumps 414.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A semiconductor die comprising:
    a semiconductor substrate that contains integrated circuits and which has a plurality of conductive pads;
    a passivation layer formed over the plurality of conductive pads, the passivation layer having a plurality of passivation layer openings, at least one of the passivation layer openings being positioned over an associated one of the plurality of conductive pads;
    a plurality of barrier base pads, at least one of which is in electrical contact with a respective one of the plurality of conductive pads, a portion of each of the plurality of barrier base pads formed over at least the perimeter of each passivation layer opening, wherein each of the barrier base pads prevents cracks from propagating through the semiconductor substrate;
    a plurality of under bump pads that are each in electrical contact with a respective one of the plurality of barrier base pads;
    a resilient protective layer formed between a portion of each of the plurality of barrier base pads and under bump pads; and
    a plurality of contact bumps that are electrically coupled with a respective one of the plurality of under bump pads.

2. A semiconductor die as recited in claim 1 wherein each of the plurality of barrier base pads has a diameter that is approximately equal to or larger than the diameter of a respective one of the under bump pads.

3. A semiconductor die as recited in claim 2 wherein the diameter of each of the under bump pads is approximately equal to a diameter of a respective bond pad located on an electronic substrate.

4. A semiconductor die as recited in claim 1 wherein each of the plurality of barrier base pads prevents cracks from propagating through at least a portion of the passivation layer.

5. A semiconductor die as recited in claim 1 wherein each of the plurality of barrier base pads has an outer perimeter extending beyond an outer perimeter of a respective one of the under bump pads.

6. A semiconductor die as recited in claim 1 wherein at least one of the plurality of under bump pads are formed of one layer of Aluminum, a second layer of Nickel Vanadium, and a third layer of Copper.

7. A semiconductor die as recited in claim 1 wherein at least one of the plurality of barrier base pads are formed of metal.

8. A semiconductor die as recited in claim 7 wherein the barrier base pads are formed of Aluminum.

9. A semiconductor die as recited in claim 1 wherein the semiconductor die is packaged to form an integrated circuit device.

10. A circuit board comprising:
    an electronic substrate having a plurality of bond pads; and
    a semiconductor die that includes, a semiconductor substrate that contains integrated circuits and which has a plurality of conductive pads;

a passivation layer formed over the plurality of conductive pads, the passivation layer having a plurality of passivation layer openings, at least one of the passivation layer openings being positioned over an associated one of the plurality of conductive pads;

a plurality of barrier base pads, at least one of which is in electrical contact with a respective one of the plurality of conductive pads, a portion of each of the plurality of barrier base pads formed over at least the perimeter of each passivation layer opening, wherein each of the plurality of barrier base pads prevents cracks from propagating through the semiconductor substrate;

a plurality of under bump pads that are each in electrical contact with a respective one of the plurality of barrier base pads;

a resilient protective layer formed between a portion of each of the plurality of barrier base pads and under bump pads; and a plurality of contact bumps that are electrically coupled with a respective one of the plurality of under bump pads, at least one of the plurality of contact bumps also being electrically coupled to one of the plurality of bond pads on the electronic substrate.

11. A circuit board as recited in claim 10 wherein each of the plurality of barrier base pads has a diameter that is approximately equal to or larger than the diameter of a respective one of the under bump pads.

12. A circuit board as recited in claim 11 wherein the diameter of each of the under bump pads is approximately equal to a diameter of a respective bond pad on the electronic substrate.

13. A circuit board as recited in claim 10 wherein each of the plurality of barrier base pads prevents cracks from propagating through at least a portion of the passivation layer.

14. A semiconductor die as recited in claim 1 wherein the resilient protective layer is made of a material having a modulus of elasticity that is less than about 3.0 Giga pascals.

15. A semiconductor die as recited in claim 14 wherein the resilient protective layer is made of polyimide or benzocyclobutene.

16. A semiconductor die as recited in claim 1 wherein the resilient protective layer is formed of 4 to 6 individual layers of resilient protective material.

17. A semiconductor die as recited in claim 1 each of the plurality of barrier base pads has a diameter that is larger than the diameter of a respective one of the conductive pads.

18. A circuit board as recited in claim 10 wherein the resilient protective layer is made of a material having a modulus of elasticity that is less than about 3.0 Giga pascals.

19. A circuit board as recited in claim 18 wherein the resilient protective layer is made of polyimide or benzocyclobutene.

20. A circuit board as recited in claim 10 wherein the resilient protective layer is formed of 4 to 6 individual layers of resilient protective material.

21. A circuit board as recited in claim 10 wherein each of the plurality of barrier base pads has a diameter that is larger than the diameter of a respective one of the conductive pads.

* * * * *